(12) United States Patent
Lim

(10) Patent No.: US 10,504,424 B2
(45) Date of Patent: Dec. 10, 2019

(54) ORGANIC LIGHT-EMITTING DISPLAY PANEL AND ORGANIC LIGHT-EMITTING DISPLAY DEVICE

(71) Applicant: LG DISPLAY CO., LTD., Seoul (KR)

(72) Inventor: YuSok Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/833,036

(22) Filed: Dec. 6, 2017

(65) Prior Publication Data
US 2018/0174510 A1 Jun. 21, 2018

(30) Foreign Application Priority Data
Dec. 21, 2016 (KR) ........................ 10-2016-0175938

(51) Int. Cl.
*G09G 3/3225* (2016.01)
*H01L 27/32* (2006.01)
(Continued)

(52) U.S. Cl.
CPC .......... *G09G 3/3225* (2013.01); *G09G 3/006* (2013.01); *G09G 3/3208* (2013.01); *H01L 27/3276* (2013.01); *G09G 3/3291* (2013.01); *G09G 2300/043* (2013.01); *G09G 2300/0426* (2013.01); *G09G 2300/0819* (2013.01); *G09G 2310/0248* (2013.01);
(Continued)

(58) Field of Classification Search
CPC .... G09G 3/3225; G09G 3/006; G09G 3/3208; G09G 2330/12; G09G 2320/0242; G09G 2310/0248; G09G 2300/043; G09G 3/3291; G09G 2320/0233; G09G 2300/0819; G09G 2300/0426; G09G 2320/0204; H01L 27/3276; H01L 27/3211; H01L 27/124; H01L 27/3262
See application file for complete search history.

(56) References Cited

U.S. PATENT DOCUMENTS 8,847,246 B2 * 9/2014 Ryu ................. H01L 27/3276
257/88
8,933,626 B2 * 1/2015 Choi ..................... H05K 13/00
313/511
(Continued)

OTHER PUBLICATIONS

Extended European Search Report dated Mar. 23, 2018 from the European Patent Office in counterpart EP application No. 17208674.6.

*Primary Examiner* — Grant Sitta
(74) *Attorney, Agent, or Firm* — Morgan, Lewis & Bockius LLP

(57) ABSTRACT

In an organic light-emitting display panel and an organic light-emitting display device, lighting lines arranged in the organic light-emitting display panel to be used for lighting inspection are connected to portions of power lines arranged in the organic light-emitting display panel, in which a voltage drop occurs. In a display driving period, a voltage the same as a voltage applied to the power lines is applied to the lighting lines. Then, the lighting lines can be used as auxiliary power lines, so that additional lines for compensating for the voltage drop are not required. Power compensation is enabled without increasing the voltage applied to the power lines. The uniformity of images can be improved without increasing power consumption.

11 Claims, 10 Drawing Sheets

(51) Int. Cl.
  *G09G 3/00* (2006.01)
  *G09G 3/3208* (2016.01)
  *H01L 27/12* (2006.01)
  *G09G 3/3291* (2016.01)

(52) U.S. Cl.
  CPC .............. *G09G 2320/0204* (2013.01); *G09G 2320/0233* (2013.01); *G09G 2320/0242* (2013.01); *G09G 2330/12* (2013.01); *H01L 27/124* (2013.01); *H01L 27/3211* (2013.01); *H01L 27/3262* (2013.01)

(56) References Cited

U.S. PATENT DOCUMENTS

| | | | |
|---|---|---|---|
| 9,269,293 | B2 | 2/2016 | Kim |
| 9,495,903 | B2 * | 11/2016 | Kwon ................. G09G 3/3225 |
| 9,626,930 | B2 * | 4/2017 | Kwak ................. G09G 3/3696 |
| 2004/0108977 | A1 | 6/2004 | Hirayama |
| 2005/0029937 | A1 * | 2/2005 | Kim ................... H01L 27/3276 313/506 |
| 2006/0022969 | A1 * | 2/2006 | Lee ................... G02F 1/136286 345/211 |
| 2006/0044237 | A1 * | 3/2006 | Lee ..................... G09G 3/3233 345/82 |
| 2009/0262048 | A1 * | 10/2009 | Park ....................... G09G 3/006 345/76 |
| 2011/0080173 | A1 * | 4/2011 | Kim ....................... G09G 3/006 324/403 |
| 2012/0026145 | A1 * | 2/2012 | Jeong ................... G09G 3/3233 345/211 |
| 2013/0208015 | A1 * | 8/2013 | Kim ..................... G09G 3/3208 345/690 |
| 2014/0239823 | A1 * | 8/2014 | Ahn ..................... G09G 3/3233 315/161 |
| 2015/0294612 | A1 * | 10/2015 | Kim ..................... G09G 3/3225 345/690 |
| 2015/0294620 | A1 * | 10/2015 | Cho ..................... G09G 3/3233 345/690 |
| 2016/0260367 | A1 * | 9/2016 | Kwak ..................... G09G 3/006 |
| 2016/0267826 | A1 * | 9/2016 | Seo ....................... G09G 3/006 |
| 2016/0358545 | A1 * | 12/2016 | Yin ..................... G09G 3/3233 |
| 2016/0365070 | A1 * | 12/2016 | Park ..................... G09G 3/3225 |
| 2017/0194593 | A1 * | 7/2017 | Ma ....................... H01L 51/5203 |

* cited by examiner

ORGANIC LIGHT-EMITTING DISPLAY PANEL AND ORGANIC LIGHT-EMITTING DISPLAY DEVICE

CROSS REFERENCE TO RELATED APPLICATION

This application claims priority from Korean Patent Application No. 10-2016-0175938, filed on Dec. 21, 2016, which is hereby incorporated by reference for all purposes as if fully set forth herein.

BACKGROUND

Technical Field

The present disclosure relates to an organic light-emitting display panel and an organic light-emitting display device.

Description of Related Art

In response to the development of the information society, there has been increasing demand for display devices able to display images. Recently, a range of display devices, such as liquid crystal display (LCD) devices, plasma display devices, and organic light-emitting display devices, have come into widespread use.

Among such display devices, organic light-emitting display devices have rapid response rates, as well as desirable features in terms of contrast ratio, luminous efficiency, luminance, and viewing angle, because organic electroluminescent (EL) devices or organic light-emitting diodes (OLEDs), able to emit light themselves, are used therein.

Such an organic light-emitting display device includes an organic light-emitting display panel having an arrangement of a plurality of gate lines, an arrangement of a plurality of data lines, a gate driver driving the plurality of gate lines, a data driver driving the plurality of data lines, a controller controlling the operation of the gate driver and the data driver, and the like.

In the organic light-emitting display panel of the organic light-emitting display device, driving voltage lines through which a driving voltage is applied may be arranged in parallel to the data lines. The driving voltage applied to subpixels through the driving voltage lines is controlled based on a data voltage applied to the data lines, so that each of the subpixels can express a grayscale depending on the data voltage corresponding thereto.

In the organic light-emitting display panel, because the driving voltage lines are arranged in the vertical direction (in the case in which the organic light-emitting display panel is erected—i.e., set upright for viewing), the driving voltage applied through the driving voltage lines gradually drops in the direction from the top portion to the bottom portion, due to load or the like present in the organic light-emitting display panel.

Such a drop in the voltage of voltage supplied through the driving voltage lines may lower the uniformity of images displayed on the organic light-emitting display panel. However, increasing the voltage applied to the driving voltage lines to compensate for the drop in the voltage may increase power consumption, which is problematic.

BRIEF SUMMARY

Accordingly, embodiments of the present disclosure are directed to an organic light-emitting display panel and an organic light-emitting display device that substantially obviate one or more of the problems due to limitations and disadvantages of the related art.

An object of the present disclosure is to provide an organic light-emitting display panel and an organic light-emitting display device able to prevent non-uniformity in images caused by a drop in a voltage applied through power lines arranged in the organic light-emitting display panel.

Another object of the present disclosure is to provide an organic light-emitting display panel and an organic light-emitting display device able to prevent a drop in a voltage applied through power lines arranged in the organic light-emitting display panel while reducing power consumption.

Additional features and advantages of the disclosure will be set forth in the description which follows, and in part will be apparent from the description, or may be learned by practice of the invention. The objectives and other advantages of the disclosure will be realized and attained by the structure particularly pointed out in the written description and claims hereof as well as the appended drawings.

To achieve these and other advantages and in accordance with the purpose of the present invention, as embodied and broadly described, an organic light-emitting display device may include: an organic light-emitting display panel; a plurality of data lines arranged in the organic light-emitting display panel; a plurality of first power lines arranged in the organic light-emitting display panel to be parallel to the plurality of data lines; a second power line arranged along an outer peripheral portion of the organic light-emitting display panel; and a lighting line arranged along the outer peripheral portion of the organic light-emitting display panel, except for a top portion of the organic light-emitting display panel, wherein, in a bottom portion of the organic light-emitting display panel, the lighting line is electrically connected to the plurality of data lines and is electrically connected to the plurality of first power lines or the second power line.

According to another aspect of the present disclosure, an organic light-emitting display panel may include: a plurality of data lines arranged in a display area of the display panel; a plurality of first power lines arranged in the display area to be parallel to the plurality of data lines; and a lighting line arranged along an outer peripheral portion of the display area, except for a top portion of the display area, wherein the lighting line is electrically connected to the plurality of data lines and the plurality of first power lines in a bottom portion of the display area.

According to another aspect of the present disclosure, an organic light-emitting display panel may include: a plurality of data lines arranged in a display area of the display panel; a second power line arranged along an outer peripheral portion of the display area; and a lighting line arranged along the outer peripheral portion of the display area, except for a top portion of the display area, wherein the lighting line is electrically connected to the plurality of data lines and the second power line in a bottom portion of the display area.

According to example embodiments, when the lighting lines, which are arranged in the organic light-emitting display panel but are not used when driving the organic light-emitting display panel, are used as the auxiliary power lines, through which a compensation driving voltage or a compensation base voltage is applied, a drop in either a driving voltage or a base voltage according to location in the organic light-emitting display panel may be prevented.

According to example embodiments, it may be possible to prevent a voltage applied to the driving voltage line or the base voltage line of the organic light-emitting display panel from dropping, thereby improving the uniformity of images displayed on the organic light-emitting display panel.

According to example embodiments, the use of the lighting lines arranged in the organic light-emitting display panel as the auxiliary power lines may reduce power consumption and reduce the number of power lines, thereby realizing a narrow bezel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
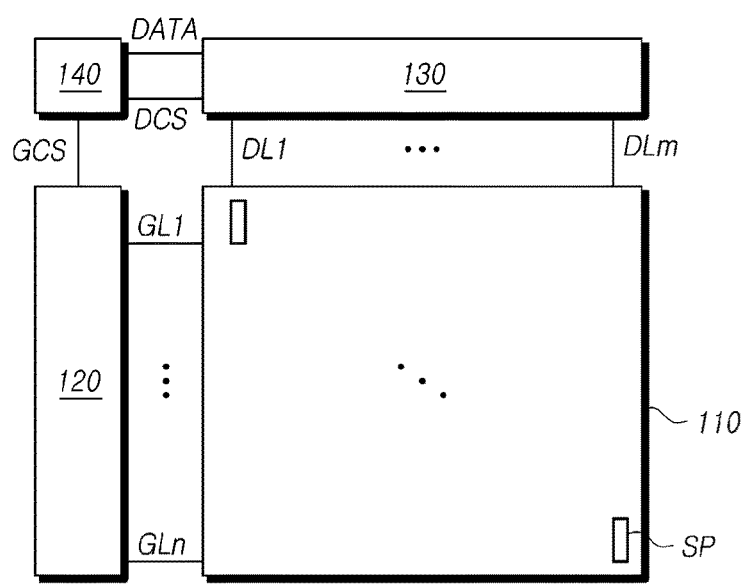
FIG. 1 schematically illustrates the configuration of an organic light-emitting display device according to example embodiments.

Reference will now be made in detail to the preferred embodiments of the present disclosure, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 schematically illustrates the configuration of an organic light-emitting display device 100 according to example embodiments.

With reference to FIG. 1, an organic light-emitting display device 100 according to example embodiments includes an organic light-emitting display panel 110 having an arrangement of a plurality of gate lines GL, an arrangement of a plurality of data lines DL, and an array of a plurality of subpixels; a gate driver 120 driving the plurality of gate lines GL; a data driver 130 driving the plurality of data lines DL; and a controller 140 driving the gate driver 120 and the data driver 130.

The gate driver 120 sequentially drives the plurality of gate lines GL by sequentially transferring a scanning signal to the plurality of gate lines GL. For example, the gate driver 120 sequentially drives the plurality of gate lines GL by sequentially transferring a scanning signal having an on or off voltage to the plurality of gate lines GL, under the control of the controller 140.

The gate driver 120 may be located on one or both sides of the organic light-emitting display panel 110, depending on the driving system, and may include one or more gate driver integrated circuits (ICs).

The gate driver ICs may be connected to the bonding pads of the organic light-emitting display panel 110 by tape-automated bonding (TAB) or by a chip-on-glass (COG) method, or may be implemented as gate-in-panel (GIP) gate driver ICs directly mounted on the organic light-emitting display panel 110.

In addition, the gate driver ICs may be integrated with the organic light-emitting display panel 110 or may be implemented as chip-on-film (COF) gate driver ICs mounted on films connected to the organic light-emitting display panel 110.

The data driver 130 drives the plurality of data lines DL by supplying a data voltage to the plurality of data lines DL. When a specific gate line among the plurality of gate lines GL is opened, the data driver 130 drives the plurality of data lines DL by converting image data received from the controller 140 into an analog data voltage and supplying the analog data voltage to the plurality of data lines DL.

The data driver 130 may include one or more source driving ICs to drive the plurality of data lines DL. The source driving ICs may be connected to the bonding pads of the organic light-emitting display panel 110 by tape-automated bonding (TAB) or by a chip-on-glass (COG) method, may be directly mounted on the organic light-emitting display panel 110, or may be integrated with the organic light-emitting display panel 110.

The source driving ICs may also be implemented as chip-on-film (COF) source driving ICs. In this case, one end of each of the source driving ICs is bonded to at least one source printed circuit board (PCB), and the other end of each of the source driving ICs is bonded to the organic light-emitting display panel 110.

The controller 140 controls the gate driver 120 and the data driver 130 by transferring a variety of control signals to the gate driver 120 and the data driver 130.

The controller 140 starts scanning based on timing realized in each frame, converts image data input from an external source into a data signal format readable by the data driver 120 before outputting converted image data, and regulates data processing at suitable points in time in response to the scanning.

The controller 140 receives, in addition to input video data, a variety of timing signals, including a vertical synchronization (Vsync) signal, a horizontal synchronization (Hsync) signal, an input data enable (DE) signal, a clock signal, and the like, from an external source (e.g., a host system).

The controller 140 not only converts image data input from the external source into a data signal format readable by the data driver 130 before outputting converted image data, but also generates a variety of control signals by receiving a variety of timing signals, such as a Vsync signal, an Hsync signal, an input DE signal, and a clock signal, and outputs the variety of control signals to the gate driver 120 and the data driver 130 in order to control the gate driver 120 and the data driver 130.

For example, the controller 140 outputs a variety of gate control signals (GCSs), including a gate start pulse (GSP), a gate shift clock (GSC), a gate output enable (GOE) signal, and the like, to control the gate driver 130.

Among these signals, the GSP controls the operation start timing of one or more gate driver ICs of the gate circuit 130. The GSC is a clock signal commonly input to the one or more gate driver ICs to control the shift timing of scanning signals (or gate pulses). The GOE signal designates timing information of the one or more gate driver ICs.

In addition, the controller 140 outputs a variety of data driving control signals, including a source start pulse (SSP), a source sampling clock (SSC), a source output enable (SOE) signal, and the like, to control the data driver 120.

Among these signals, the SSP controls the data sampling start timing of one or more source driver ICs of the data driver 120. The SSC is a clock signal controlling the sampling timing of data in each of the source driver ICs. The SOE signal controls the output timing of the data driver 120.

The controller 140 may be disposed on a control PCB connected to the source PCB, to which the source driver ICs are bonded, via a connector, such as a flexible flat cable (FFC) or a flexible printed circuit (FPC).

The control PCB may have a power controller (not shown) disposed thereon. The power controller (not shown) supplies a variety of voltages or currents to the organic light-emitting display panel 110, the gate driver 120, the data driver 130, and the like or controls the variety of voltages or currents to be supplied to the same. The power controller (not shown) is also referred to as a power management IC (PMIC).

The organic light-emitting display panel 110 of the organic light-emitting display device 100 may be provided with power lines (e.g., driving voltage lines, reference voltage lines, or base voltage lines) through which a voltage for driving the organic light-emitting display panel 110 is applied.

The power lines may be arranged to be parallel to the data lines DL in the organic light-emitting display panel 110 or may be arranged along the outer peripheral portions of the organic light-emitting display panel 110.

A voltage supplied through the power lines may be introduced through the top portion of the organic light-emitting display panel 110 to be delivered to the interior of the organic light-emitting display panel 110. In this case, in the bottom portion of the organic light-emitting display panel 110, the voltage introduced through the top portion of the organic light-emitting display panel 110 is dropped, due to load or the like present in the organic light-emitting display panel 110.

Figure 2:
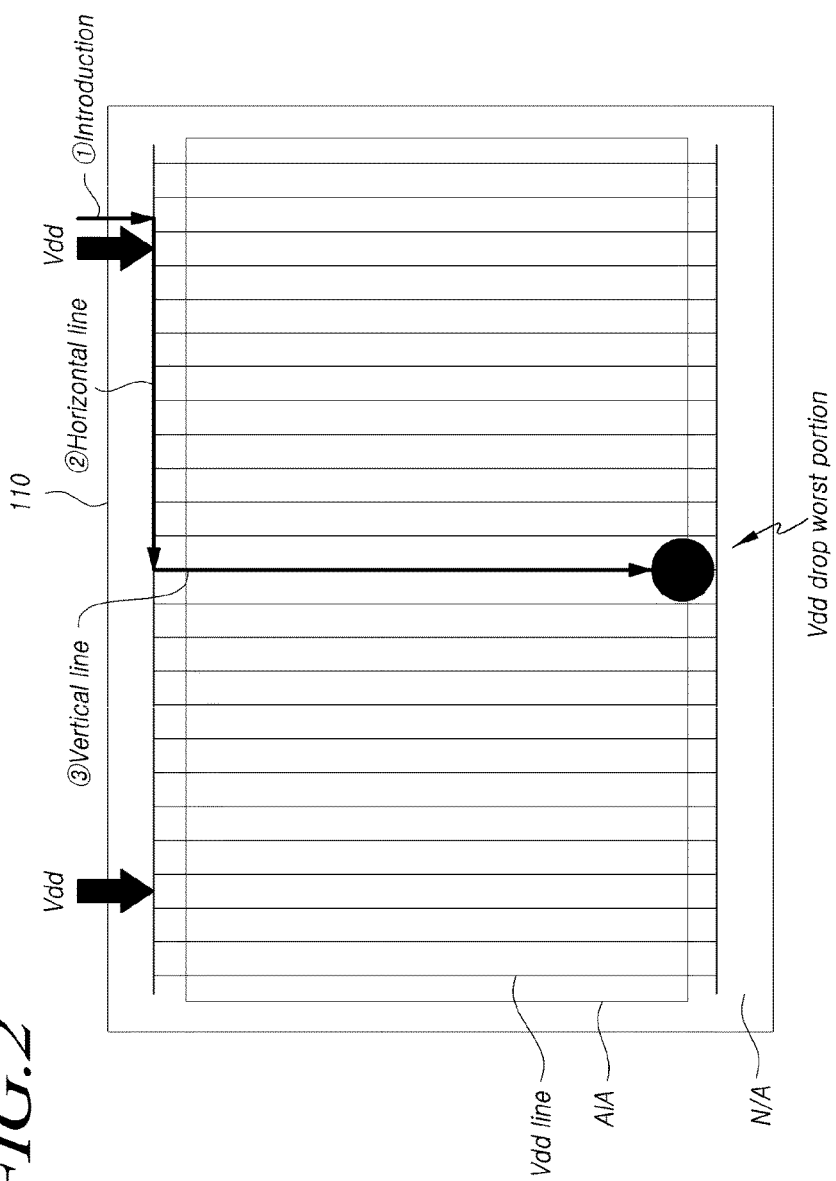
FIG. 2 illustrates a voltage drop occurring in a driving voltage in the organic light-emitting display device according to example embodiments.

FIG. 2 illustrates a voltage drop occurring when a driving voltage Vdd is applied through the driving voltage lines in the organic light-emitting display panel 110 of the organic light-emitting display device 100 according to example embodiments.

With reference to FIG. 2, in the organic light-emitting display panel 110 according to example embodiments, a plurality of driving voltage lines are arranged in a display area A/A in a column direction, e.g. a vertical direction (in the case in which the organic light-emitting display panel 110 is erected), while a plurality of driving voltage lines are arranged in non-display areas N/A in the top portion and the bottom portion of the light-emitting display panel 110, in a row direction, e.g. a horizontal direction (in the case in which the organic light-emitting display panel 110 is erected).

When the driving voltage Vdd is introduced to the top portion of the organic light-emitting display panel 110 (①), the driving voltage Vdd flows through a horizontal line (②) to be delivered to a vertical line (③).

The driving voltage Vdd introduced through the top portion of the organic light-emitting display panel 110 gradually drops in the direction from the top portion to the bottom portion, so that a difference in the voltage between the top portion and the bottom portion may occur.

This may cause non-uniform images to be displayed on the organic light-emitting display panel 110. When the voltage introduced is increased to compensate for the voltage drop, power consumption may be increased, which is problematic.

Example embodiments provide an organic light-emitting display device 100 that is able to improve the uniformity of images by compensating for the voltage drop in the power lines without increasing power consumption, by using lighting lines arranged in the organic light-emitting display panel 110 as auxiliary power lines.

Figure 3:
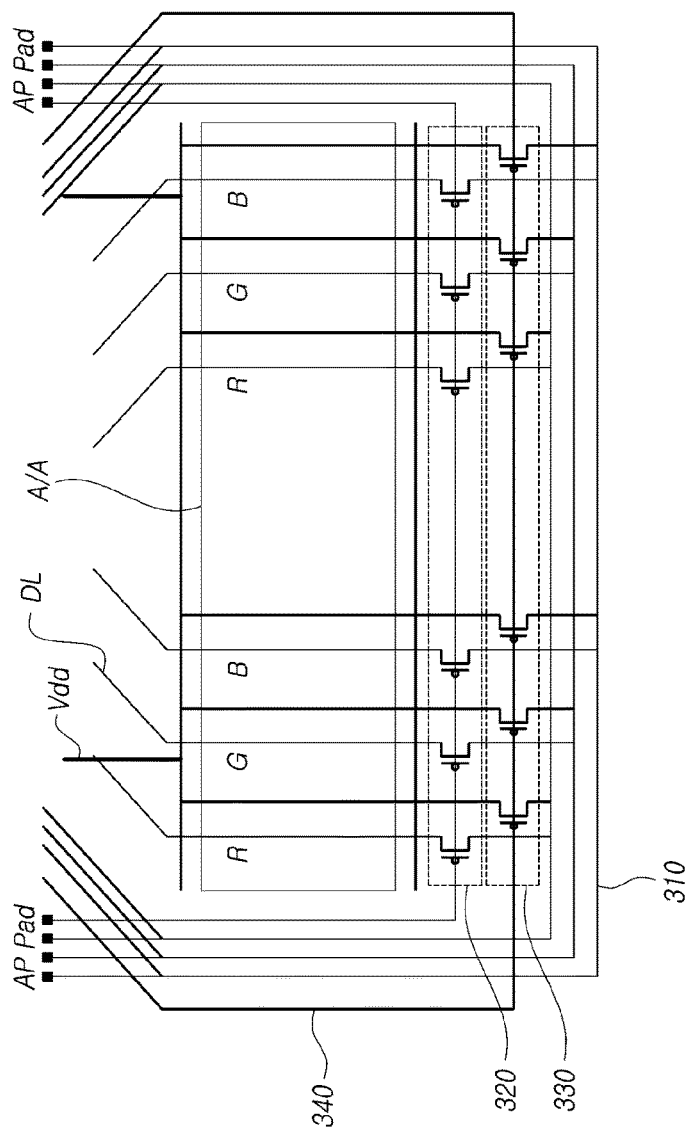
FIG. 3 illustrates an example structure of auxiliary power lines for a driving voltage in the organic light-emitting display device according to example embodiments.

FIG. 3 illustrates an example structure in which lighting lines are used as auxiliary power lines for driving voltage lines among power lines in the organic light-emitting display panel 110 of the organic light-emitting display device 100.

With reference to FIG. 3, in the organic light-emitting display panel 110 according to example embodiments, (in the case in which the organic light-emitting display panel 110 is erected), driving voltage lines are arranged in the top portion and the bottom portion in a horizontal direction, while driving voltage lines are arranged in a display area in a vertical direction.

In addition, lighting lines 310 are arranged along outer peripheral portions of the organic light-emitting display panel 110 except for the top portion.

In the bottom portion of the organic light-emitting display panel 110, the lighting lines 310 are electrically connected to a plurality of data lines DL vertically arranged in the organic light-emitting display panel 110.

In addition, in the bottom portion of the organic light-emitting display panel 110, the lighting lines 310 are electrically connected to a plurality of driving voltage lines arranged in the vertical direction in the organic light-emitting display panel 110.

Because the lighting lines 310 arranged in the organic light-emitting display panel 110 are configured to be electrically connected to the data lines DL and the driving voltage lines, the lighting lines 310 can be connected to the data lines DL to enable lighting inspection in the case of lighting inspection and can be connected to the driving voltage lines to be used as auxiliary power lines in the case of display driving.

Specifically, the lighting lines 310 are connected to data lines DL via lighting transistors 320 in the bottom portion of the organic light-emitting display panel 110.

In addition, the lighting lines 310 are connected to the driving voltage lines via first transistors 330 in the bottom portion of the organic light-emitting display panel 110.

A first auxiliary driving line 340 through which a turn-on signal for turning on the first transistors 330 is applied is connected to gate nodes of the first transistors 330.

In a display driving period (or "section"), the turn-on signal for the first transistors 330 is applied through the first auxiliary driving line 340, and a voltage the same as a voltage applied through the driving voltage line is applied through the lighting lines 310.

The voltage applied through the lighting line 310 is delivered to the driving voltage lines connected to the lighting lines 310 arranged in the bottom portion of the organic light-emitting display panel 110.

Because the driving voltage Vdd applied to the lighting lines 310 is applied to the driving voltage lines arranged in the bottom portion of the organic light-emitting display panel 110 in the display driving period, it is possible to compensate for a voltage drop in the driving voltage Vdd, introduced through the top portion of the organic light-emitting display panel 110, occurring in the bottom portion of the organic light-emitting display panel 110.

This can consequently compensate for the voltage drop of the driving voltage Vdd without increasing the voltage level of the driving voltage Vdd applied to the driving voltage lines of the organic light-emitting display panel 110, thereby preventing non-uniformity in images due to the voltage drop of the driving voltage Vdd.

In addition, because the lighting lines 310 arranged in the organic light-emitting display panel 110 to be used for lighting inspection without being used in the display driving period are used as the auxiliary power lines, no new lines for compensating for the driving voltage Vdd are required to be additionally arranged, so that a narrow bezel may be realized.

Figure 4:
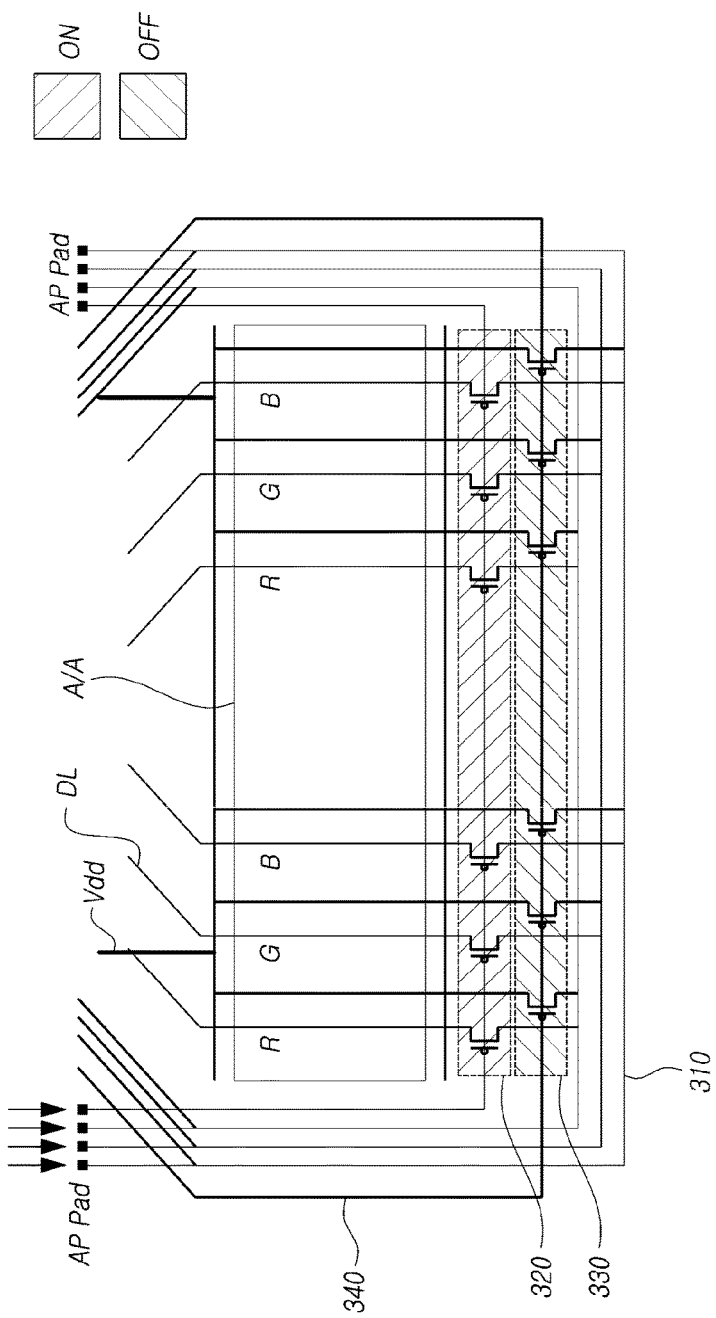
FIGS. 4 to 6 illustrate the operation of auxiliary power lines for a driving voltage in the organic light-emitting display device according to example embodiments.
Figure 5:
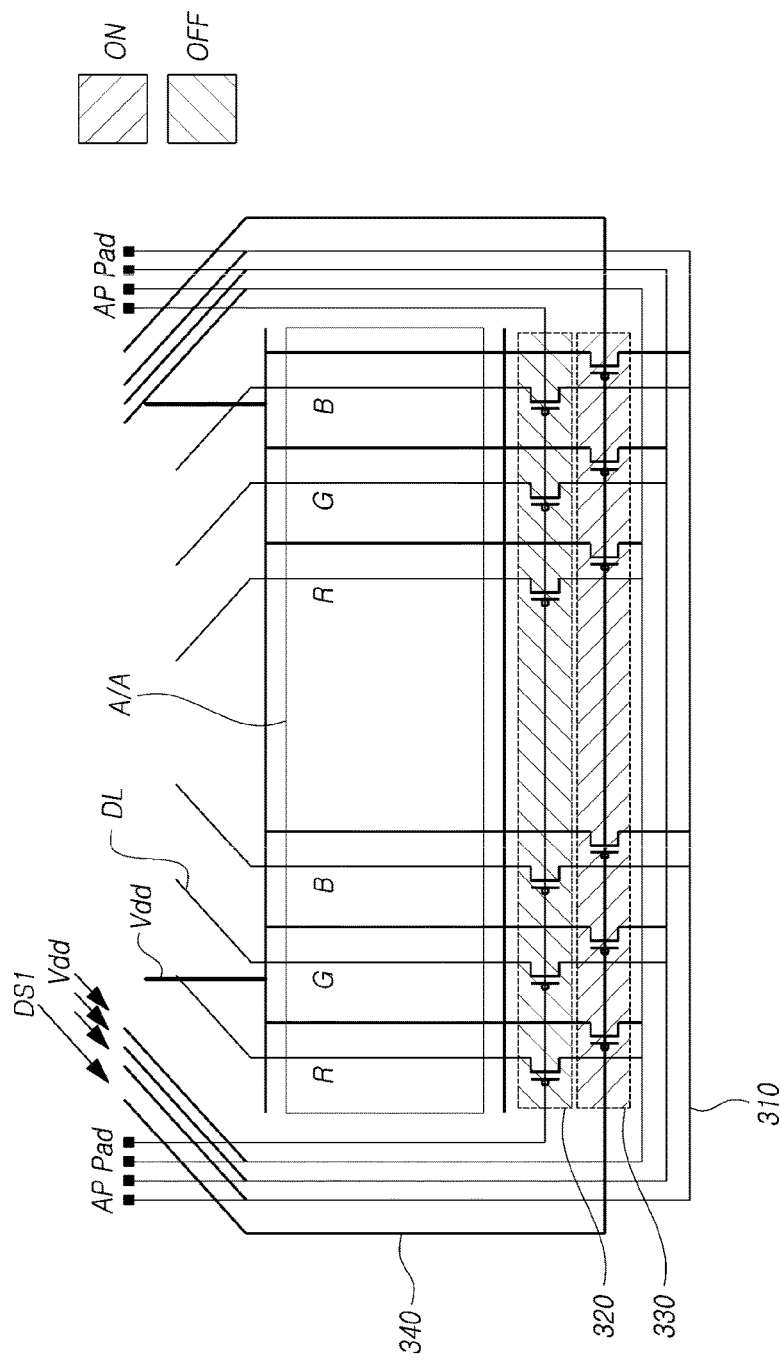
Figure 6:
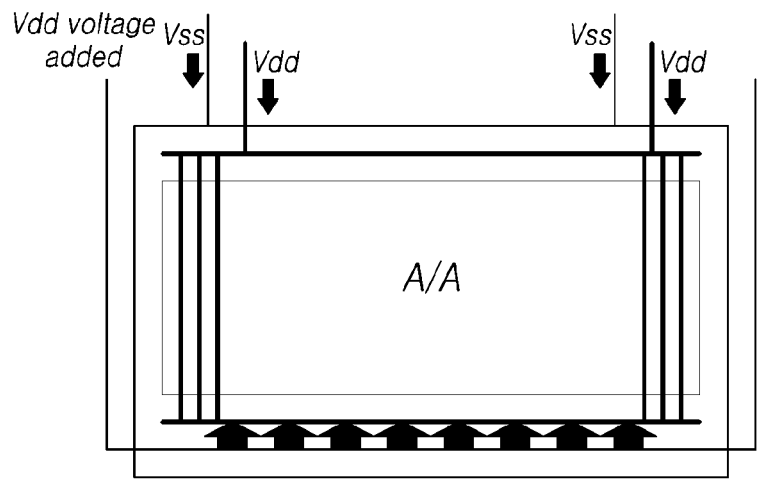

FIGS. 4 to 6 illustrate a driving method of the organic light-emitting display device 100 in a case in which the lighting lines 310 are used as auxiliary power lines for the driving voltage lines in the organic light-emitting display device 100 according to example embodiments.

FIG. 4 is an example view illustrating the operation of the transistors connected to the lighting lines 310 and a voltage applied to the lighting lines 310 in the case of lighting inspection in the organic light-emitting display device 100 according to example embodiments.

With reference to FIG. 4, while a lighting inspection is being performed, a data voltage for the lighting inspection is applied to the lighting lines 310 in the organic light-emitting display panel 110.

In addition, a turn-on signal, for turning the lighting transistors 320 connected between the lighting lines 310 and the data lines DL on, is applied to gate nodes of the lighting transistors 320.

In this case, the first transistors 330 connected between the lighting lines 310 and the driving voltage lines remain in an off state.

Thus, in the case of lighting inspection, the data voltage applied through the lighting lines 310 is delivered to the data lines DL, so that the lighting inspection can be performed.

FIG. 5 is an example view illustrating the operation of the transistors connected to the lighting lines 310 and a voltage applied to the lighting lines 310 in the case of display driving in the organic light-emitting display device 100 according to example embodiments.

With reference to FIG. 5, in the display driving period, a driving voltage Vdd is applied to the driving voltage lines, and a voltage the same as the driving voltage Vdd is applied to the lighting lines 310.

In addition, a first auxiliary driving signal DS1 for turning on the first transistors 330 is applied to the first auxiliary driving lines 340 connected to the gate nodes of the first transistors 330 connected between the lighting lines 310 and the driving voltage lines.

In this case, the lighting transistors 320 connected between the lighting lines 310 and the data lines DL remain in an off state.

As the first auxiliary driving signal DS1 is applied to the gate nodes of the first transistors 330, the driving voltage Vdd applied through the lighting lines 310 is delivered to the driving voltage lines arranged in the bottom portion of the organic light-emitting display panel 110.

The lighting lines 310 are connected to points at which the driving voltage lines arranged in the vertical direction cross the driving voltages arranged in the horizontal direction in the bottom portion of the organic light-emitting display panel 110.

Specifically, the lighting lines 310 are connected to the points of the vertically-arranged driving voltage lines at which a voltage drop is most significant, so that the drop of the driving voltage Vdd applied to the driving voltage lines can be effectively compensated for.

FIG. 6 illustrates the operation of compensating for a drop in a driving voltage Vdd applied to the driving voltage lines by applying a driving voltage Vdd through the lighting lines 310 in the organic light-emitting display device 100 according to example embodiments.

With reference to FIG. 6, in the display driving period, in the top portion of the organic light-emitting display panel 110, the driving voltage Vdd is applied to the driving voltage lines arranged in the organic light-emitting display panel 110.

In addition, the same driving voltage as the driving voltage Vdd is applied to the lighting lines 310 arranged along the outer peripheral portions, except for the top portion of the organic light-emitting display panel 110.

As the driving voltage Vdd, applied to the lighting lines 310, is delivered to the driving voltage lines arranged in the bottom portion of the organic light-emitting display panel 110, a drop in the driving voltage Vdd, applied to the driving voltage lines, can be compensated for in the bottom portion of the organic light-emitting display panel 110.

In particular, because the lighting lines 310, arranged for lighting inspection in the organic light-emitting display panel 110 without being used in the display driving period, are used as auxiliary power lines in the display driving period of the organic light-emitting display panel 110, it is not required to increase the driving voltage Vdd to compensate for the drop in the driving voltage Vdd. This can consequently compensate for the drop in the driving voltage Vdd while reducing power consumption.

In addition, because it is not required to additionally arrange auxiliary lines for compensating for the drop in the driving voltage Vdd, a narrow bezel can be easily realized.

Figure 7:
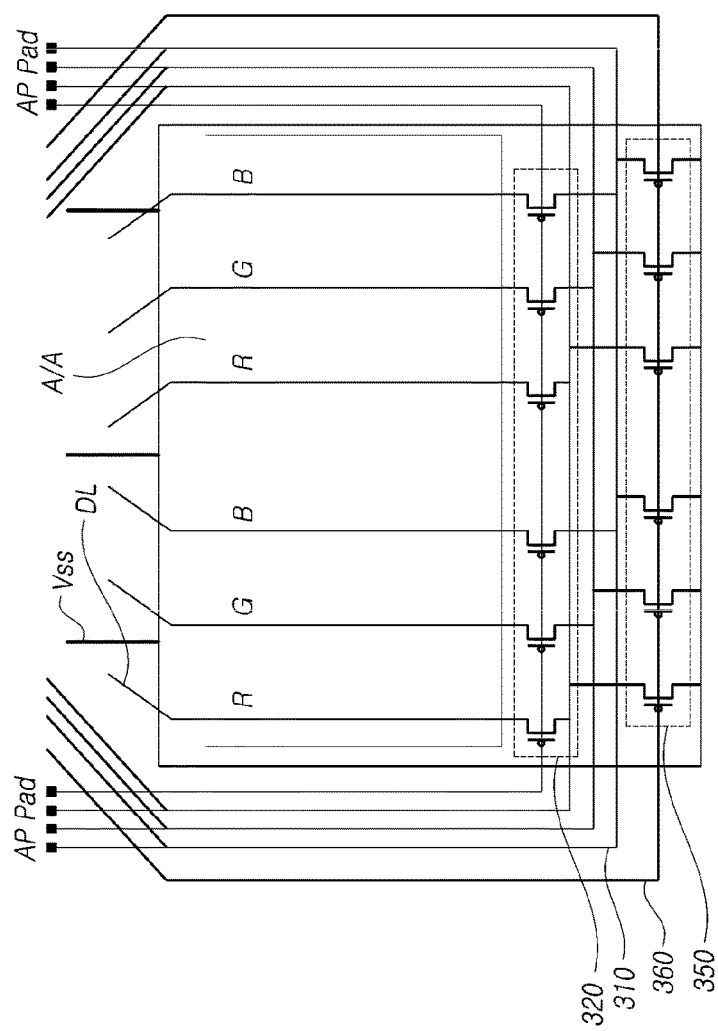
FIG. 7 illustrates an example structure of auxiliary power lines for a base voltage in the organic light-emitting display device according to example embodiments.

FIG. 7 illustrates an example structure in which the lighting lines 310 are used as auxiliary power lines for compensating for a base voltage Vss applied to base voltage lines in the organic light-emitting display device 100 according to example embodiments.

With reference to FIG. 7, in the organic light-emitting display panel 110 according to example embodiments, the base voltage lines are arranged along the outer peripheral portions of the organic light-emitting display panel 110.

In addition, the lighting lines 310 are arranged along the outer peripheral portions of the organic light-emitting display panel 110, except for the top portions of the organic light-emitting display panel 110.

The lighting lines 310 are electrically connected to the data lines DL in the bottom portion of the organic light-emitting display panel 110. In addition, the lighting lines 310 are electrically connected to the base voltage lines in the bottom portion of the organic light-emitting display panel 110.

The lighting transistors 320 are disposed between the lighting lines 310 and the data lines DL, while second transistors 350 are disposed between the lighting lines 310 and the base voltage lines.

Second auxiliary driving lines 360 are connected to gate nodes of the second transistors 350, and a turn-on signal for turning on the second transistors 350 is applied to the second auxiliary driving lines 360 in the display driving period.

During lighting inspection, the lighting inspection is performed by only turning on the lighting transistors 310 while leaving the second transistors 360 turned off.

During display driving, the second transistors 350 are turned on while the lighting transistors 310 are left turned off. In addition, a voltage the same as the base voltage Vss, applied to the base voltage lines, is applied to the lighting lines 310, so that the voltage is delivered to the base voltage lines arranged in the bottom portion of the organic light-emitting display panel 110 through the lighting lines 310.

Because the voltage, applied to the lighting lines 310, is delivered to the base voltage lines, as described above, the base voltage Vss, applied to the base voltage lines, can be prevented from dropping in the bottom portion of the organic light-emitting display panel 110.

Figure 8:
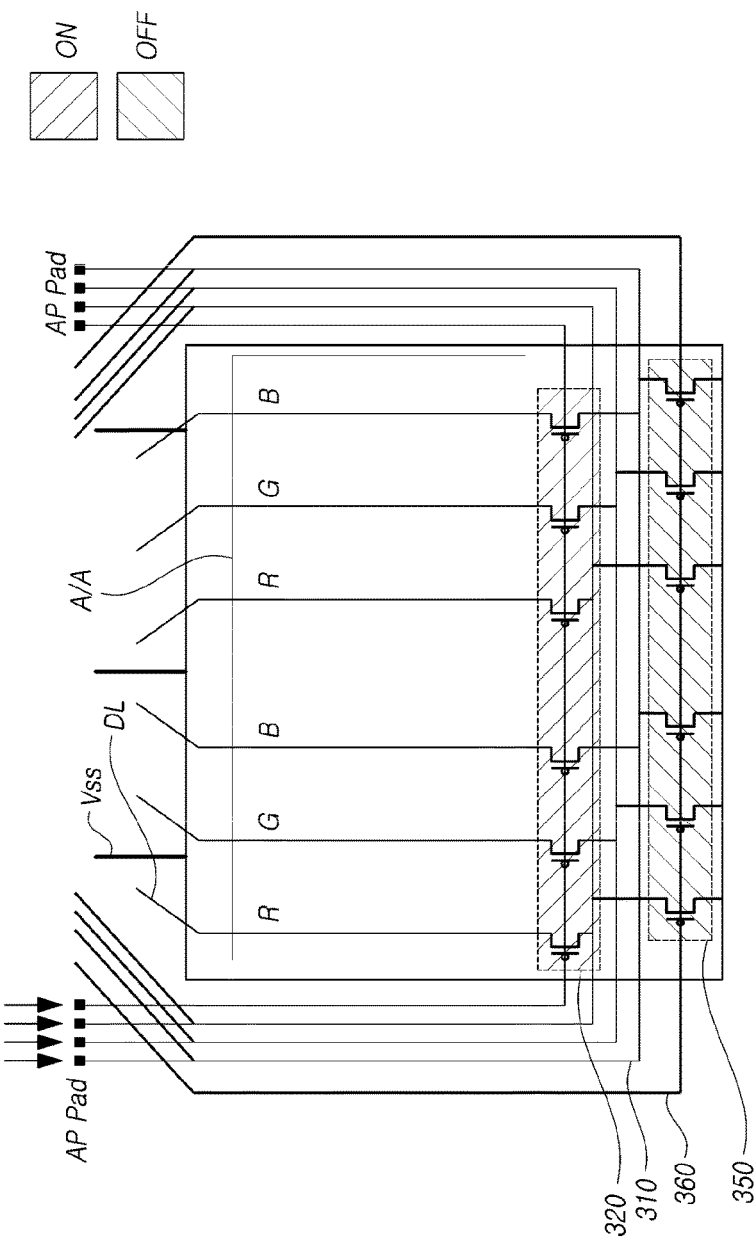
FIGS. 8 to 10 illustrate the operation of auxiliary power lines for a base voltage in the organic light-emitting display device according to example embodiments.
Figure 9:
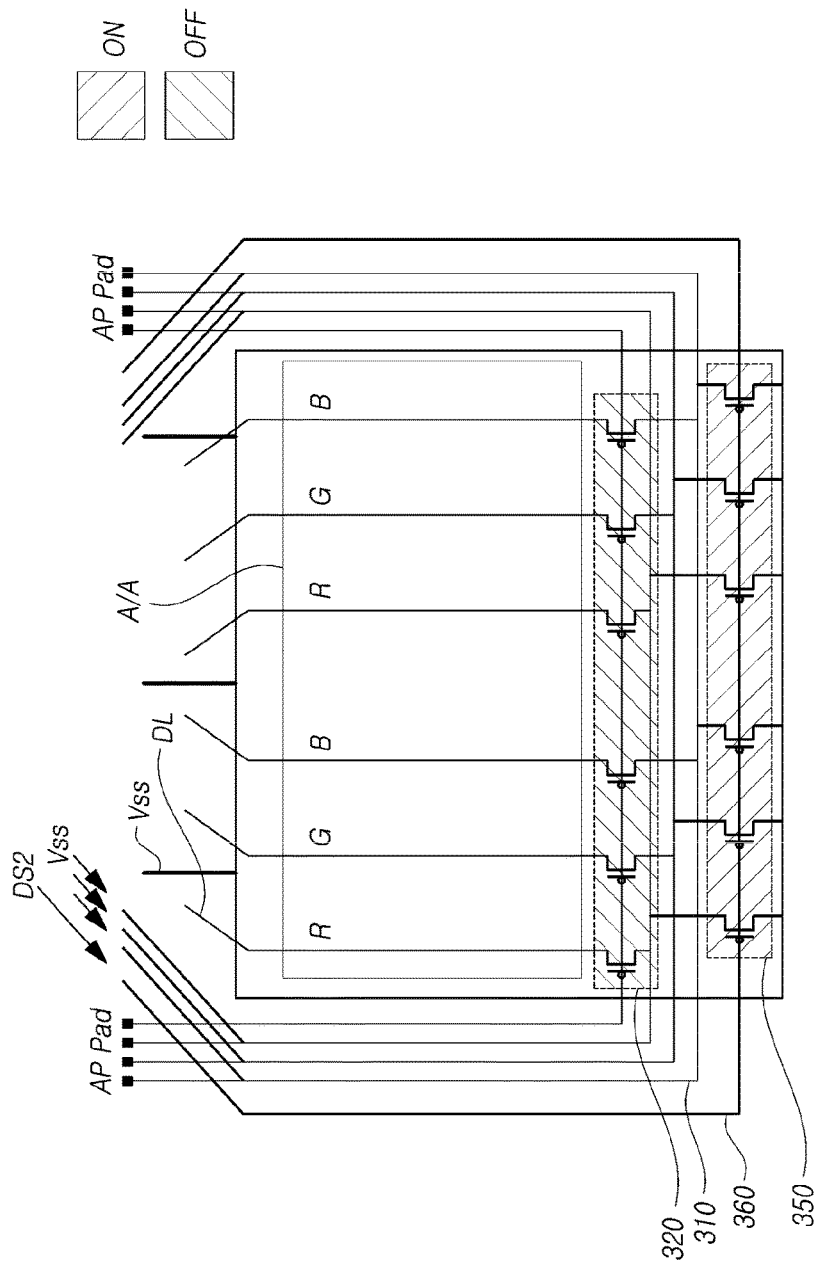
Figure 10:
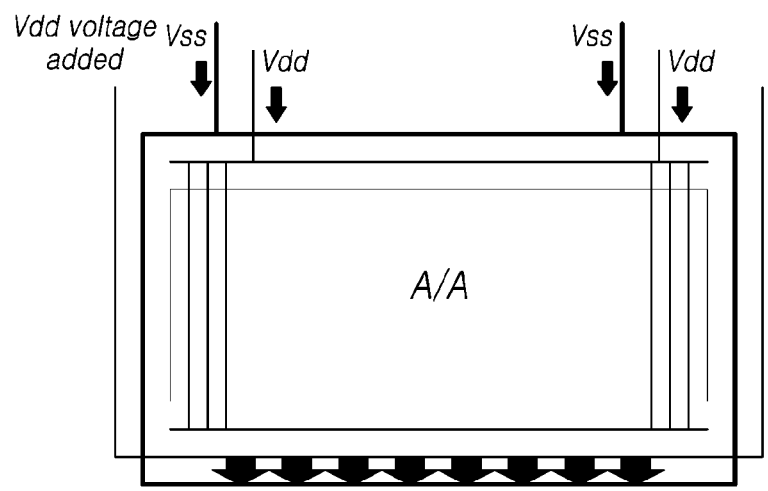

FIGS. 8 to 10 illustrate a driving method in a case in which the lighting lines 310 are used as auxiliary power lines for a base voltage Vss in the organic light-emitting display device 100 according to example embodiments.

FIG. 8 illustrates the operation of the lighting lines 310 during lighting inspection. During lighting inspection, a data voltage is applied to the lighting lines 310, and the lighting transistors 320 are turned on, allowing the data voltage, applied to the lighting lines 310, to be delivered to the data lines DL.

At this time, the second transistors 350 connected between the lighting lines 310 and the base power lines remain turned off.

This consequently makes it possible to perform lighting inspection using the lighting lines 310 and by driving the lighting transistors 320.

FIG. 9 illustrates the operation of the lighting lines 310 in a display driving period.

With reference to FIG. 9, a base voltage Vss is applied to the base voltage lines in the display driving period.

A voltage the same as the base voltage Vss, applied to the base voltage lines, is applied to the lighting lines 310, and a second auxiliary voltage driving signal DS2, for turning the second transistors 350 on, is applied to the second auxiliary driving lines 360.

At this time, the lighting transistors 320 connected between the lighting lines 310 and the data lines DL remain in an off state.

As the second auxiliary voltage driving signal DS2 is applied, the voltage applied to the lighting lines 310 is delivered to the base voltage lines arranged in the bottom portion of the organic light-emitting display panel 110.

Because the voltage, applied through the lighting lines 310, is delivered to the base voltage lines arranged in the bottom portion of the organic light-emitting display panel 110, the base voltage Vss is prevented from dropping in the base voltage lines arranged in the bottom portion of the organic light-emitting display panel 110.

It is therefore possible to compensate for a drop in the base voltage Vss, applied to the base voltage lines arranged in the organic light-emitting display panel 110, using the lighting lines 310 arranged in the organic light-emitting display panel 110.

Because the drop in the base voltage Vss is compensated for using the lighting lines 310, it is possible to compensate for the base voltage Vss without requiring additional lines for the compensation while reducing power consumption.

FIG. 10 illustrates an operation of compensating for a drop in a base voltage Vss applied to the base voltage lines using a base voltage Vss applied through the lighting lines 310 in the organic light-emitting display device 100 according to example embodiments.

With reference to FIG. 10, in the display driving period, the base voltage Vss is applied to the base voltage lines arranged along the outer peripheral portions of the organic light-emitting display panel 110.

In addition, a voltage the same as the base voltage Vss, applied to the base voltage lines, is applied through the lighting lines 310 arranged along the outer peripheral portions of the organic light-emitting display panel 110, except for the top portion of the organic light-emitting display panel 110.

The second transistors 350, connecting the lighting lines 310 and the base voltage lines in the bottom portion of the organic light-emitting display panel 110, are turned on, so that the voltage, applied to the lighting lines 310, is delivered to the base voltage lines arranged in the bottom portion of the organic light-emitting display panel 110.

Because the voltage, applied through the lighting lines 310, is delivered to the base voltage lines, a drop in the base voltage Vss in the base voltage lines, arranged in the bottom portion of the organic light-emitting display panel 110, can be compensated for.

Consequently, the base voltage Vss, applied to the base voltage lines, can be effectively compensated for, thereby preventing non-uniform images from being displayed due to the voltage drop in the base voltage lines.

Although the foregoing embodiments have been described in relation to cases in which the lighting lines 310 are used as the auxiliary power lines for the driving voltage lines and the base voltage lines, the lighting lines 310 may also be used to compensate for a voltage drop in a variety of other power lines, such as reference voltage lines, arranged in the organic light-emitting display panel 110.

According to example embodiments, a drop in a voltage applied to the power lines arranged in the organic light-emitting display panel 110 can be easily compensated for, by using the lighting lines 310, arranged in the organic light-emitting display panel 110 without being used in the display driving period, as the auxiliary power lines.

It is possible to compensate for a voltage drop in the power lines using the lighting lines 310 without increasing power consumption or additionally arranging lines.

It is thereby possible to prevent non-uniform images that would otherwise be caused by a drop in a voltage applied to the power lines arranged in the organic light-emitting display panel 110.

It will be apparent to those skilled in the art that various modifications and variations can be made in the organic light-emitting display panel and an organic light-emitting display device of the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light-emitting display device, comprising:
an organic light-emitting display panel;
a plurality of data lines arranged in the organic light-emitting display panel;
a plurality of first power lines arranged in the organic light-emitting display panel to be parallel to the plurality of data lines;
a second power line arranged along an outer peripheral portion of the organic light-emitting display panel;
a lighting line arranged along the outer peripheral portion of the organic light-emitting display panel, except for a top portion of the organic light-emitting display panel;
lighting transistors connected between the plurality of data lines and the lighting line, whereby the lighting line is electrically connected to the plurality of data lines through the lighting transistors; and
first transistors connected between the plurality of first power lines and the lighting line, whereby the lighting line is electrically connected to the plurality of first power lines through the first transistors,
wherein, in a bottom portion of the organic light-emitting display panel, the lighting line is electrically connected to the plurality of data lines and is electrically connected to the plurality of first power lines or the second power line, and
wherein, in a display driving period, the lighting transistors are in an off state, and the first transistors are in an on state.

2. The organic light-emitting display device according to claim 1, further comprising a first auxiliary driving line connected to gate nodes of the first transistors, wherein a signal for turning the first transistors on is applied to the first auxiliary driving line in the display driving period.

3. The organic light-emitting display device according to claim 1, wherein a same voltage is applied to the plurality of first power lines and the lighting line in the display driving period.

4. The organic light-emitting display device according to claim 1, further comprising:
a first horizontal line arranged in the top portion of the organic light-emitting display panel to connect one ends of the plurality of first power lines to each other; and
a second horizontal line arranged in the bottom portion of the organic light-emitting display panel to connect the other ends of the plurality of first power lines to each other,
wherein the lighting line is connected to nodes at which the plurality of first power lines and the second horizontal line are connected.

5. An organic light-emitting display device comprising:
an organic light-emitting display panel;
a plurality of data lines arranged in the organic light-emitting display panel;
a plurality of first power lines arranged in the organic light-emitting display panel to be parallel to the plurality of data lines;
a second power line arranged along an outer peripheral portion of the organic light-emitting display panel;
a lighting line arranged along the outer peripheral portion of the organic light-emitting display panel, except for a top portion of the organic light-emitting display panel;
lighting transistors connected between the plurality of data lines and the lighting line, whereby the lighting line is electrically connected to the plurality of data lines through the lighting transistors; and
a second transistor connected between the second power line and the lighting line, whereby the lighting line is electrically connected to the second power line through the second transistor,
wherein, in a bottom portion of the organic light-emitting display panel, the lighting line is electrically connected to the plurality of data lines and is electrically connected to the plurality of first power lines or the second power line, and
wherein a same voltage is applied to the second power line and the lighting line in a display driving period.

6. The organic light-emitting display device according to claim 5, further comprising a second auxiliary driving line connected to a gate node of the second transistor, wherein a signal for turning the second transistor on is applied to the second auxiliary driving line in the display driving period.

7. An organic light-emitting display panel, comprising:
a plurality of data lines arranged in a display area of the display panel;
a plurality of first power lines arranged in the display area to be parallel to the plurality of data lines;
a lighting line arranged along an outer peripheral portion of the display area, except for a top portion of the display area;
lighting transistors connected between the plurality of data lines and the lighting line, whereby the lighting line is electrically connected to the plurality of data lines through the lighting transistors;
first transistors connected between the plurality of first power lines and the lighting line, whereby the lighting line is electrically connected to the plurality of first power lines through the first transistors; and
a first auxiliary driving line connected to gate nodes of the first transistors,
wherein the lighting line is electrically connected to the plurality of data lines and the plurality of first power lines in a bottom portion of the display area, and
wherein, in a display driving period, the lighting transistors are in an off state, and the first transistors are turned on by a signal applied through the first auxiliary driving line.

8. The organic light-emitting display panel according to claim 7, wherein a same voltage is applied to the plurality of first power lines and the lighting line in the display driving period.

9. An organic light-emitting display panel, comprising:
a plurality of data lines arranged in a display area of the display panel;
a second power line arranged along an outer peripheral portion of the display area;
a lighting line arranged along the outer peripheral portion of the display area, except for a top portion of the display area;
lighting transistors connected between the plurality of data lines and the lighting line, whereby the lighting line is electrically connected to the plurality of data lines through the lighting transistors;

a second transistor connected between the second power line and the lighting line, whereby the lighting line is electrically connected to the second power line through the second transistor; and a second auxiliary driving line connected to a gate node of the second transistor, wherein the lighting line is electrically connected to the plurality of data lines and the second power line in a bottom portion of the display area, and wherein, in a display driving period, the lighting transistors are in an off state, and the second transistor remains turned on by a signal applied through the second auxiliary driving line.

10. The organic light-emitting display panel according to claim 9, wherein a same voltage is applied to the second power line and the lighting line in the display driving period.

11. The organic light-emitting display device according to claim 5, wherein the lighting transistors are in an off state and the second transistor is in an on state in the display driving period.

* * * * *